US007656208B2

(12) United States Patent
Kimura et al.

(10) Patent No.: US 7,656,208 B2
(45) Date of Patent: Feb. 2, 2010

(54) PLL OSCILLATION CIRCUIT

(75) Inventors: Hiroki Kimura, Hokkaido (JP); Tsukasa Kobata, Hokkaido (JP); Yasuo Kitayama, Hokkaido (JP); Naoki Onishi, Hokkaido (JP)

(73) Assignee: Nihon Dempa Kogyo., Ltd., Tokyo (JP)

( * ) Notice: Subject to any disclaimer, the term of this patent is extended or adjusted under 35 U.S.C. 154(b) by 23 days.

(21) Appl. No.: 11/812,520

(22) Filed: Jun. 19, 2007

(65) Prior Publication Data

US 2008/0042708 A1 Feb. 21, 2008

(30) Foreign Application Priority Data

Jun. 19, 2006 (JP) ............................ 2006-168626

(51) Int. Cl.
*H03L 7/06* (2006.01)

(52) U.S. Cl. ...................................... 327/159; 327/150

(58) Field of Classification Search ....................... None
See application file for complete search history.

(56) References Cited

U.S. PATENT DOCUMENTS 4,706,300 A * 11/1987 Minemura et al. .......... 398/204
5,132,554 A * 7/1992 Hiramatsu et al. .......... 327/154
5,254,955 A * 10/1993 Saeki et al. ................ 327/156
6,150,858 A * 11/2000 Sung .......................... 327/156
6,876,242 B2 * 4/2005 Zampetti et al. ............ 327/292
7,212,748 B2 * 5/2007 Koga .......................... 398/202
2005/0245205 A1 11/2005 Huang et al.

FOREIGN PATENT DOCUMENTS

JP 10-013228 1/1998
JP 2004-253945 9/2004

* cited by examiner

*Primary Examiner*—Cassandra Cox
(74) *Attorney, Agent, or Firm*—Jacobson Holman PLLC

(57) ABSTRACT

A digitally controlled PLL oscillation circuit has a VCO, a frequency divider, a reference oscillation circuit, an A/D converter, a phase comparator, a digital filter, a D/A converter, and an analog filter. A reference signal supplied from the reference oscillation circuit is output through a narrow-band crystal filter (MCF) to the A/D converter to cancel noise, jitter and a spurious wave included in the reference signal, making it possible to prevent the phase noise characteristic and spurious characteristic of a VCO output from being degraded.

17 Claims, 10 Drawing Sheets

1
VCO
Fout
FREQUENCY DIVIDER (1/N)
2
4
A/D CONVERTER
11
MCF
3
Fref
5
PHASE COMPARATOR
6
DIGITAL FILTER
7
D/A CONVERTER
8
ANALOG FILTER VCO
FREQUENCY DIVIDER (1/N)
Fout
A/D CONVERTER
AMP
MCF
Fref
PHASE COMPARATOR
DIGITAL FILTER
D/A CONVERTER
ANALOG FILTER
1
2
3
4
5
6
7
8
11
12

VCO
1
Fout
FREQUENCY DIVIDER (1/N)
2
A/D CONVERTER
4
AMP
12
MCF
11
Fref
3
MCF
13
AMP
14
PHASE COMPARATOR
5
MCF
15
AMP
16
D/A CONVERTER
7
DIGITAL FILTER
6
ANALOG FILTER
8

VCO
1
Fout
FREQUENCY DIVIDER (1/N)
2
A/D CONVERTER
4
PHASE COMPARATOR
5
DIGITAL FILTER
6
D/A CONVERTER
7
ANALOG FILTER
8
AMP
23
MCF
22
3
Fref

PLL OSCILLATION CIRCUIT

BACKGROUND OF THE INVENTION

1. Field of the Invention

The present invention relates to a PLL (Phase Locked Loop) oscillation circuit, and, more particularly, to a PLL oscillation circuit which prevents the phase noise characteristic and spurious characteristic of a VCO (Voltage Controlled Oscillator) output from being degraded.

2. Description of the Related Art

A conventional digitally controlled PLL oscillation circuit will be described referring to FIG. 10. FIG. 10 is a configuration block diagram of the conventional digitally controlled PLL oscillation circuit.

As shown in FIG. 10, the conventional digitally controlled PLL oscillation circuit has a VCO 1, a frequency divider 2, a reference oscillation circuit 3, an A/D (Analogue/Digital) converter 4, a phase comparator 5, a digital filter 6, a D/A (Digital/Analogue) converter 7, and an analog filter 8.

The VCO 1 is a voltage controlled oscillator that generates a desired frequency Fout in response to an input from the analog filter 8 as a control voltage.

The frequency divider 2 divides the oscillation frequency Fout generated by the VCO 1 to 1/N, and sends the resultant frequency to the A/D converter 4.

The reference oscillation circuit 3 generates a reference signal (reference clock) Fref.

The A/D converter 4 converts an analog signal from the frequency divider 2 to a digital signal according to the reference clock supplied from the reference oscillation circuit 3.

The phase comparator 5 compares the phase of the digital signal from the A/D converter 4 with the phase of the reference signal from the reference oscillation circuit 3, and outputs a phase difference signal.

The digital filter 6 filters the phase difference signal from the phase comparator 5.

The D/A converter 7 converts the digital signal from the digital filter 6 to an analog signal according to the reference clock supplied from the reference oscillation circuit 3.

The analog filter 8 smooths the analog signal from the D/A converter 7, and outputs the analog signal as a control voltage to the VCO 1.

Japanese Patent Application Laid-Open No. 2004-253945 discloses a related art relating to a PLL circuit. The related art is a signal phase synchronization apparatus that stably extracts a clock with a less frequency variation from a PLL circuit using a bandpass filter (XBPF) comprising a crystal oscillator.

The related art is premised on an analogously controlled PLL circuit and configured to allow a reproduction signal input to the phase comparator to pass the XBPF.

In the PLL oscillation circuit, the reference signal Fref is used in each of the A/D converter 4, the phase comparator 5 and the D/A converter 7. Because the reference signal Fref significantly influences the PLL performance, the reference signal Fref should desirably be stable free of noise, jitter or a spurious wave.

If the reference signal contains noise, jitter or a spurious wave, however, the phase noise characteristic and spurious characteristic of the output Fout of the VCO 1 would be degraded.

Particularly, the A/D converter 4 generates a digital signal to be subjected to phase comparison, and is likely to be influenced by the reference signal Fref, thereby significantly influencing the whole PLL oscillation circuit.

SUMMARY OF THE INVENTION

The present invention has been made in consideration of the aforementioned situation, and it is an object of the invention to provide a PLL oscillation circuit capable of preventing the phase noise characteristic and spurious characteristic of a VCO output from being degraded.

The first aspect of the invention is a digitally controlled PLL oscillation circuit including a voltage controlled oscillator; a frequency divider that divides an output from the voltage controlled oscillator; a reference oscillation circuit that generates a reference signal; an A/D converter that performs analog-to-digital conversion of an output from the frequency divider based on the reference signal; a phase comparator that compares a phase of an output from the A/D converter with a phase of the reference signal; a digital filter that filters an output from the phase comparator; a D/A converter that performs digital-to-analog conversion of an output from the digital filter based on the reference signal; an analog filter that smooths an output of the D/A converter and outputs as a control signal for the voltage controlled oscillator; and a first narrow-band crystal filter provided between the reference oscillation circuit and the A/D converter so that the reference signal to be supplied to the A/D converter from the reference oscillation circuit passes through the first narrow-band crystal filter. The PLL oscillation circuit can therefore cancel noise, jitter or a spurious wave contained in the reference signal, resulting in improvements of the phase noise characteristic and spurious characteristic of the output of the voltage controlled oscillator.

According to the PLL oscillation circuit of the first aspect, a first amplifier is provided between the first narrow-band crystal filter and the A/D converter to amplify a signal from the first narrow-band crystal filter. When the signal level is made lower by the crystal filter, therefore, the level can be amplified to an adequate level.

According to the PLL oscillation circuit of the first aspect, a second narrow-band crystal filter is provided between the reference oscillation circuit and the phase comparator so that the reference signal to be supplied to the phase comparator from the reference oscillation circuit passes through the second narrow-band crystal filter. The PLL oscillation circuit can therefore cancel noise, jitter or a spurious wave contained in the reference signal, resulting in improvements of the phase noise characteristic and spurious characteristic of the output of the voltage controlled oscillator.

According to the PLL oscillation circuit of the first aspect, a second amplifier is provided between the second narrow-band crystal filter and the phase comparator to amplify a signal from the second narrow-band crystal filter. When the signal level is made lower by the crystal filter, therefore, the level can be amplified to an adequate level.

According to the PLL oscillation circuit of the first aspect, a third narrow-band crystal filter is provided between the reference oscillation circuit and the D/A converter so that the reference signal to be supplied to the D/A converter from the reference oscillation circuit passes through the third narrow-band crystal filter. The PLL oscillation circuit can therefore cancel noise, jitter or a spurious wave contained in the reference signal, resulting in improvements of the phase noise characteristic and spurious characteristic of the output of the voltage controlled oscillator.

According to the PLL oscillation circuit of the first aspect, a third amplifier is provided between the third narrow-band crystal filter and the D/A converter to amplify a signal from the third narrow-band crystal filter. When the signal level is made lower by the crystal filter, therefore, the level can be amplified to an adequate level.

The second aspect of the invention is a digitally controlled PLL oscillation circuit including a voltage controlled oscillator; a frequency divider that divides an output from the voltage controlled oscillator; a reference oscillation circuit that generates a reference signal; an A/D converter that performs analog-to-digital conversion of an output from the frequency divider based on the reference signal; a phase comparator that compares a phase of an output from the A/D converter with a phase of the reference signal; a digital filter that filters an output from the phase comparator; a D/A converter that performs digital-to-analog conversion of an output from the digital filter based on the reference signal; an analog filter that smooths an output of the D/A converter and outputs as a control signal for the voltage controlled oscillator; and a fourth narrow-band crystal filter provided at an output stage of the reference oscillation circuit so that the reference signal supplied from the reference oscillation circuit is output through the fourth narrow-band crystal filter to the A/D converter, the phase comparator and the D/A converter. The PLL oscillation circuit can therefore cancel noise, jitter or a spurious wave contained in the reference signal, resulting in improvements of the phase noise characteristic and spurious characteristic of the output of the voltage controlled oscillator.

The third aspect of the invention is a digitally controlled PLL oscillation circuit including a voltage controlled oscillator; a frequency divider that divides an output from the voltage controlled oscillator; a reference oscillation circuit that generates a reference signal; an A/D converter that performs analog-to-digital conversion of an output from the frequency divider based on the reference signal; a phase comparator that compares a phase of an output from the A/D converter with a phase of the reference signal; a digital filter that filters an output from the phase comparator; a D/A converter that performs digital-to-analog conversion of an output from the digital filter based on the reference signal; an analog filter that smooths an output of the D/A converter and outputs as a control signal for the voltage controlled oscillator; and a fifth narrow-band crystal filter and a fourth amplifier that are provided at an output stage of the reference oscillation circuit so that the reference signal supplied from the reference oscillation circuit passes through the fifth narrow-band crystal filter, is amplified by the fourth amplifier, and is output to the A/D converter, the phase comparator and the D/A converter. The PLL oscillation circuit can therefore cancel noise, jitter or a spurious wave contained in the reference signal, resulting in improvements of the phase noise characteristic and spurious characteristic of the output of the voltage controlled oscillator and allowing the level to be amplified to an adequate level when the signal level is made lower by the crystal filter.

DESCRIPTION OF REFERENCE NUMERALS

Figure 1:
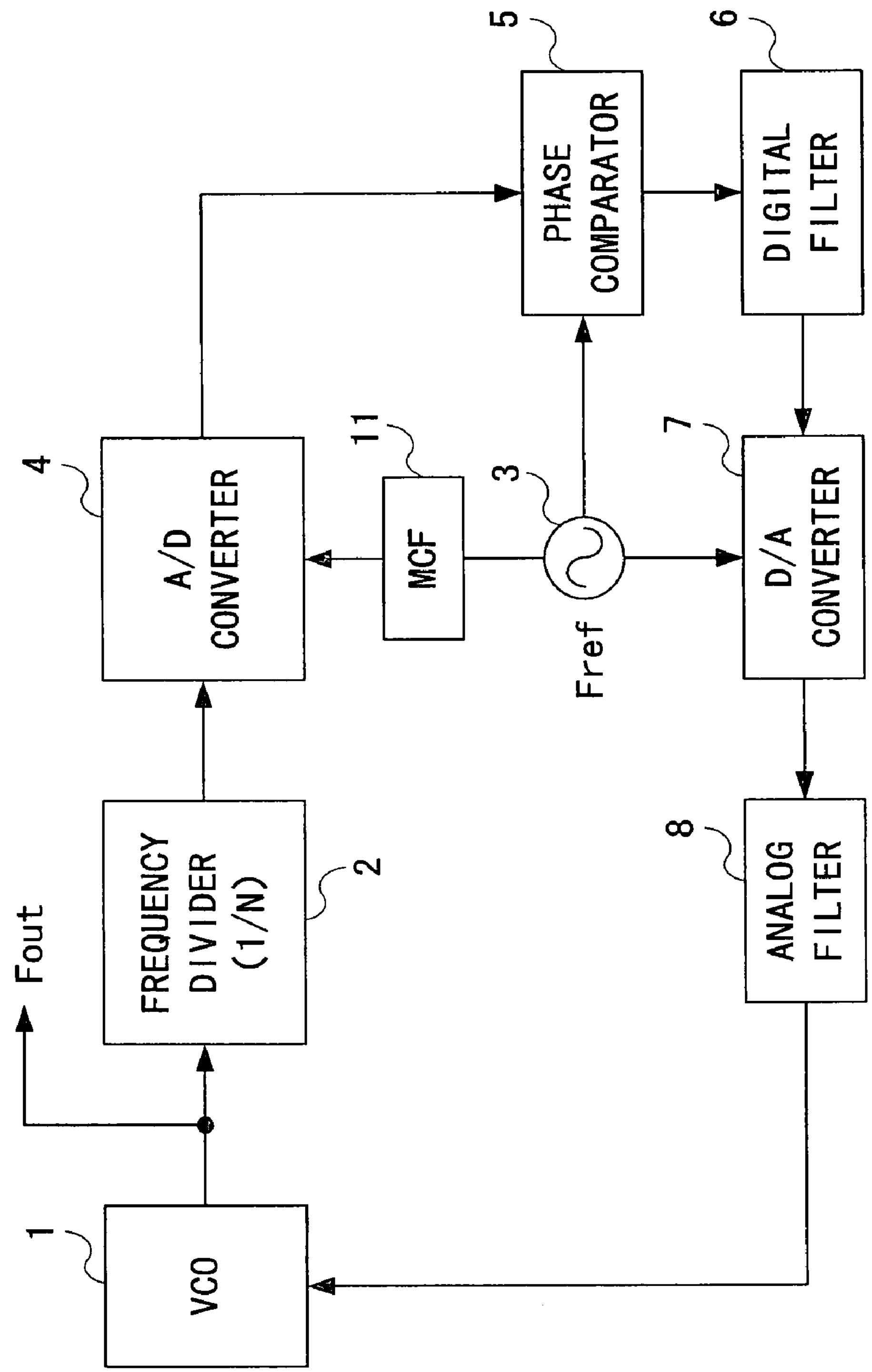
FIG. 1 is a configuration block diagram of a PLL oscillation circuit according to a first embodiment of the present invention.

1: VCO
2: frequency divider
3: reference oscillation circuit
4: A/D converter
5: phase comparator
6: digital filter
7: D/A converter
8: analog filter
11, 13, 15: MCF
12, 14, 16: AMP
21: MCF
22: MCF
23: AMP

DETAILED DESCRIPTION OF THE PREFERRED EMBODIMENTS

Preferred embodiments of the present invention will now be described referring to the accompanying drawings.

A PLL oscillation circuit according to embodiments of the invention is a digitally controlled PLL oscillation circuit configured in such a way that a reference signal to be supplied to an A/D converter which performs A/D conversion of the output of a VCO is let to pass through a narrow-band crystal filter, thereby canceling noise, jitter or a spurious wave contained in the reference signal. As a result, the phase noise characteristic and spurious characteristic of the output of the VCO can be improved.

Figure 10:
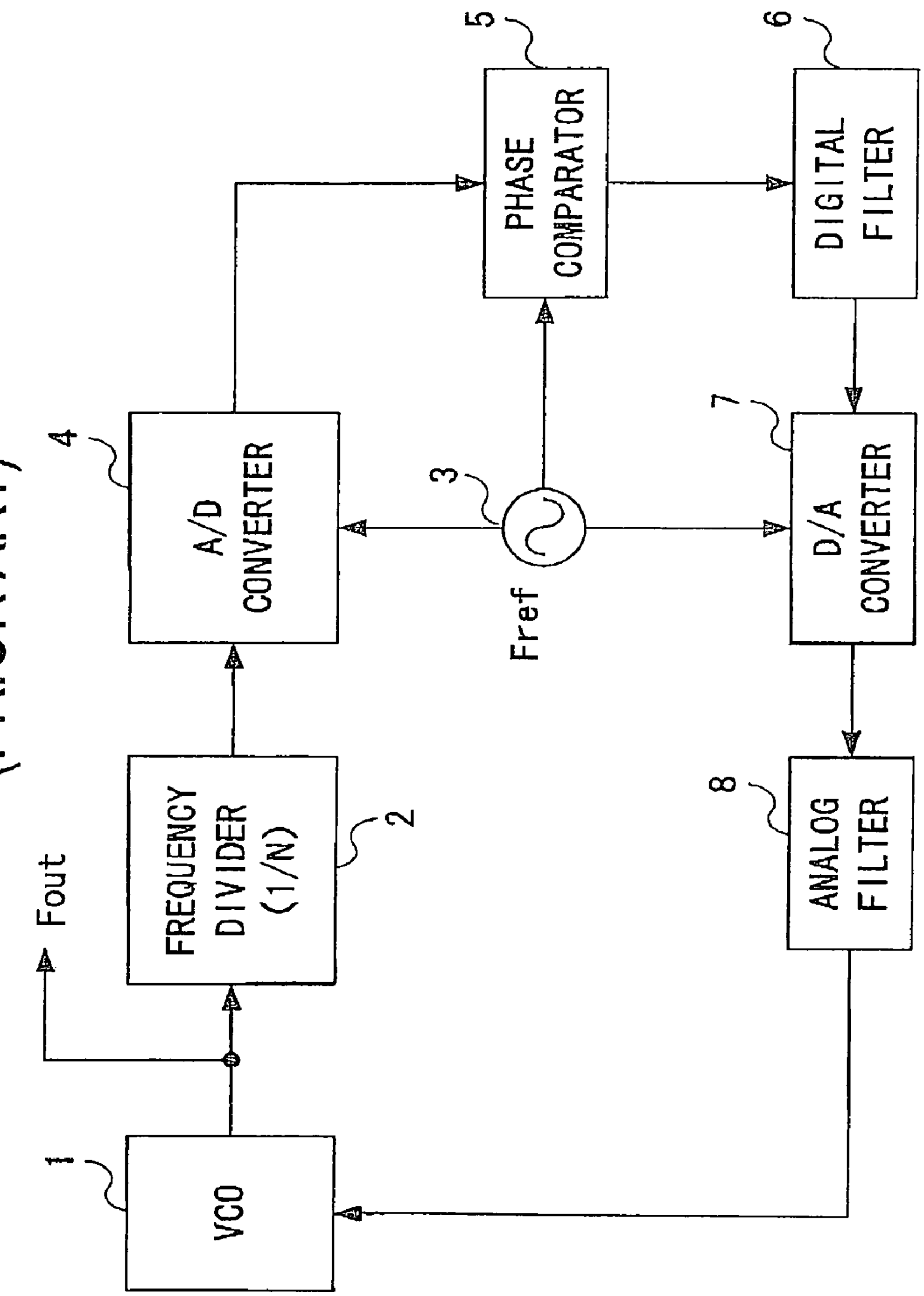
FIG. 10 is a configuration block diagram of the conventional digitally controlled PLL oscillation circuit.

A PLL oscillation circuit according to a first embodiment of the invention will be described referring to FIG. 1. FIG. 1 is a configuration block diagram of the PLL oscillation circuit according to the first embodiment of the invention. In the following description, same reference numerals will be given to those components in FIG. 1 which have the same structures as the components in FIG. 10.

As shown in FIG. 1, the PLL oscillation circuit (first PLL oscillation circuit) according to the first embodiment of the invention has a VCO 1, a frequency divider 2, a reference oscillation circuit 3, an A/D converter 4, a phase comparator 5, a digital filter 6, a D/A converter 7, an analog filter 8, and a narrow band filter (MCF: Monolithic Crystal Filter) 11.

The VCO 1 is a voltage controlled oscillator that generates a desired frequency Fout in response to an input from the analog filter 8 as a control voltage.

The frequency divider 2 divides the oscillation frequency Fout generated by the VCO 1 to 1/N, and sends the resultant frequency to the A/D converter 4.

The reference oscillation circuit 3 generates a reference signal (reference clock) Fref.

The A/D converter 4 receives the reference clock supplied from the reference oscillation circuit 3 through the MCF 11, and converts an analog signal from the frequency divider 2 to a digital signal according to the reference clock.

The phase comparator 5 compares the phase of the digital signal from the A/D converter 4 with the phase of the reference signal from the reference oscillation circuit 3, and outputs a phase difference signal.

The digital filter 6 filters the phase difference signal from the phase comparator 5.

The D/A converter 7 converts the digital signal from the digital filter 6 to an analog signal according to the reference clock supplied from the reference oscillation circuit 3.

The analog filter 8 smooths the analog signal from the D/A converter 7, and outputs the analog signal as a control voltage to the VCO 1.

The MCF (first narrow-band crystal filter) 11 is a narrow-band filter which makes the use of the high stability of crystal and the sharp cut-off characteristic thereof.

The MCF is a crystal filter which has plural pairs of electrode provided on a single AT-cut crystal base plate (crystal piece with the major axis being in parallel to the X axis and tilted from the Z axis by about 35° and from an r plane by about −3°) in such a way that as the electrodes of the electrode pair are set closer to each other, the oscillation mode of one oscillator enters an area where it is coupled to the oscillation mode of the other oscillator. This causes so-called acoustic coupling in which the oscillation energy is transferred from one oscillation to another. The MCF uses this coupling in filtering.

In the first PLL oscillation circuit, insertion of the MCF 11 between the reference oscillation circuit 3 and the A/D converter 4 cancels noise, jitter or a spurious wave contained in the reference signal, resulting in improvements of the phase noise characteristic and spurious characteristic of the output Fout of the VCO 1.

Figure 2:
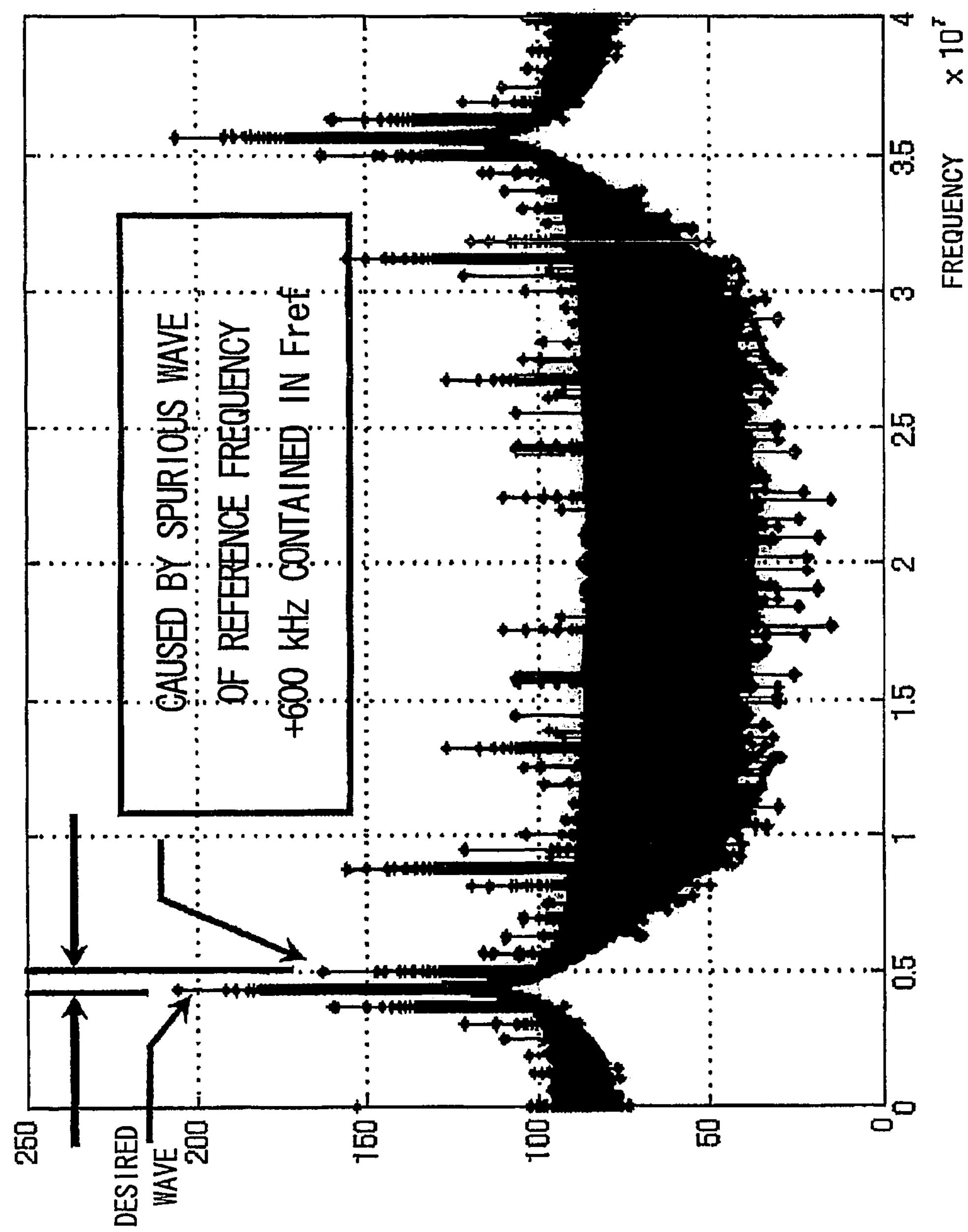
FIG. 2 is a diagram showing the result of analyzing a digital signal output from an A/D converter when a reference frequency signal contains a spurious wave.
Figure 3:
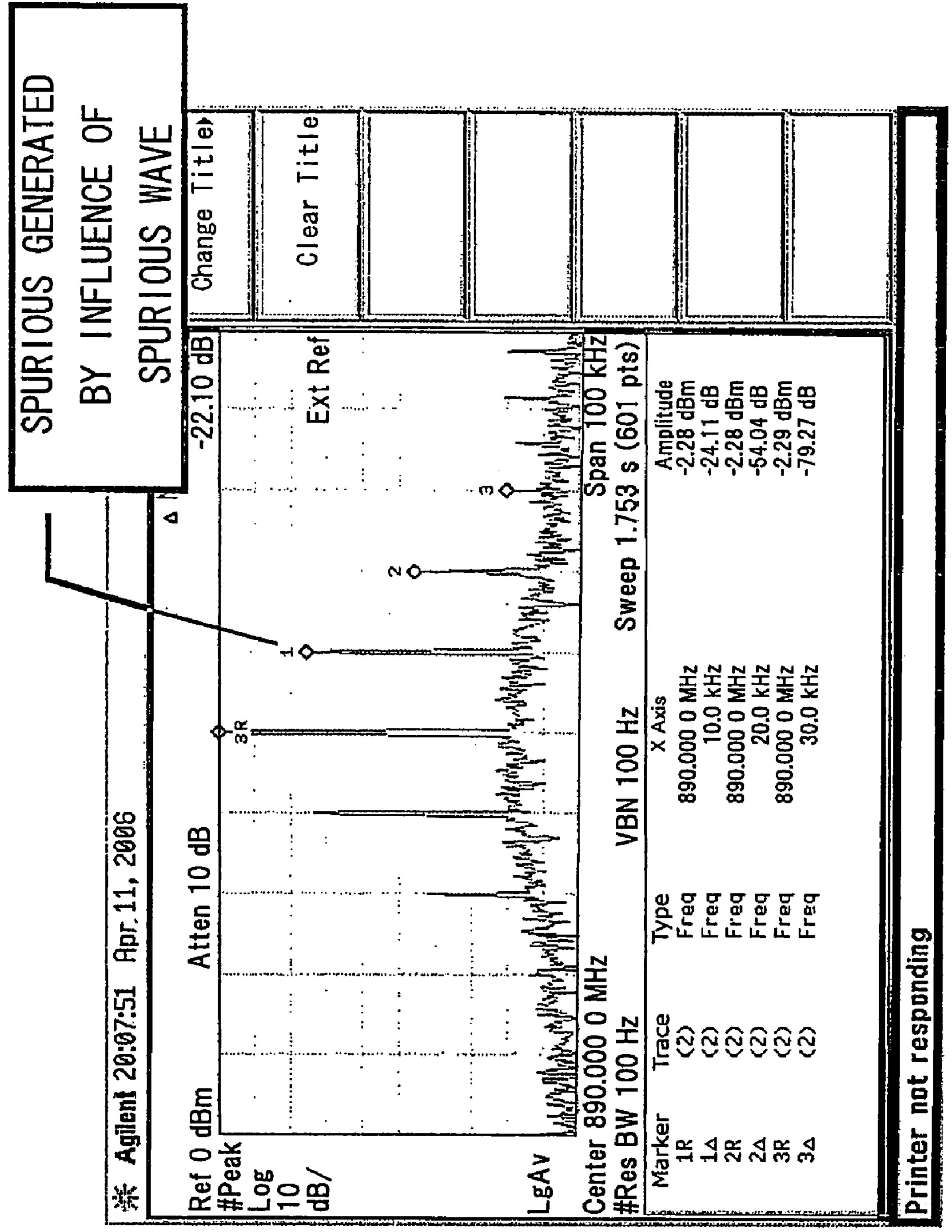
FIG. 3 is a diagram showing the spurious characteristic of an output Fout when an MCF is not inserted.
Figure 4:
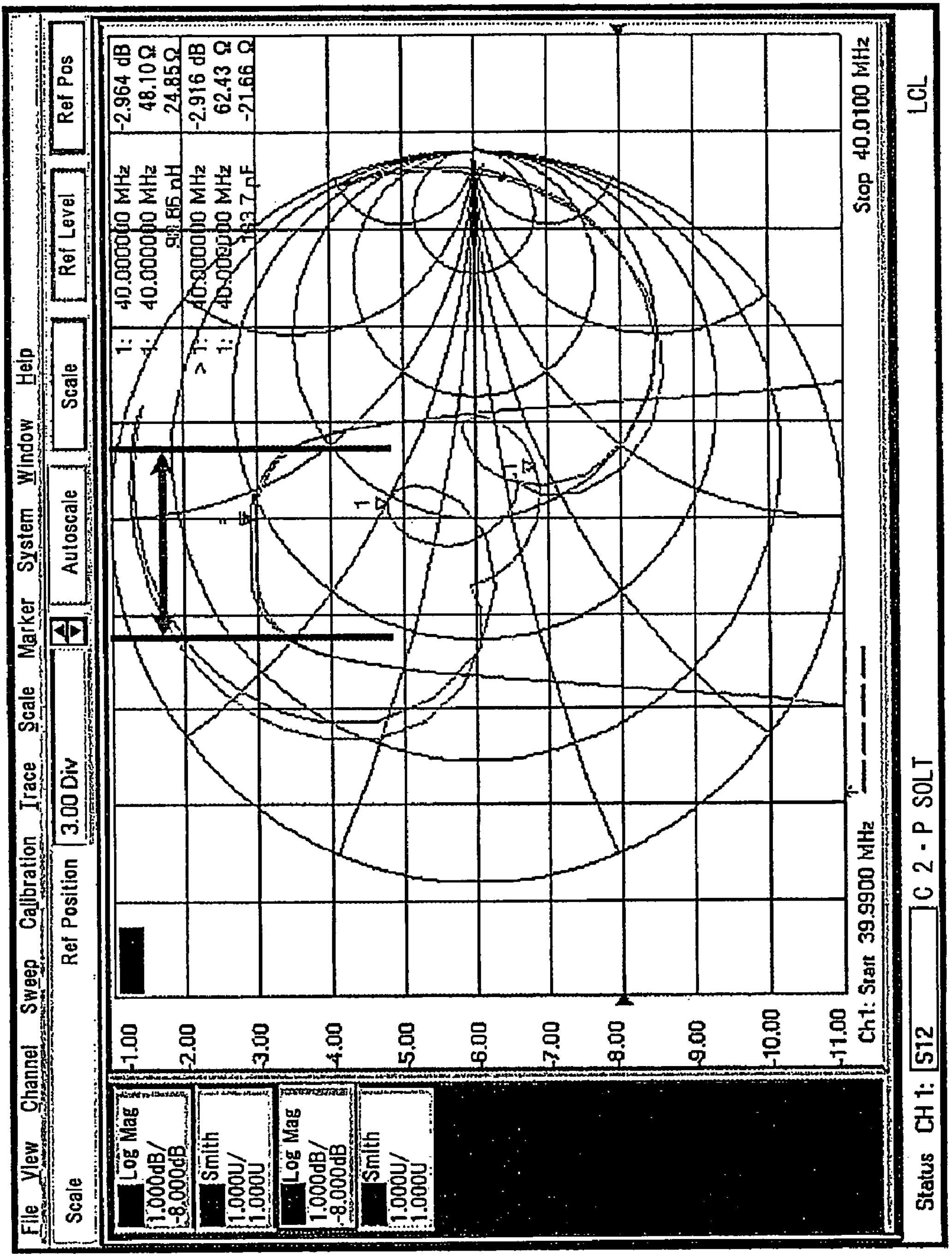
FIG. 4 is a diagram showing the transfer characteristic of an MCF inserted.
Figure 5:
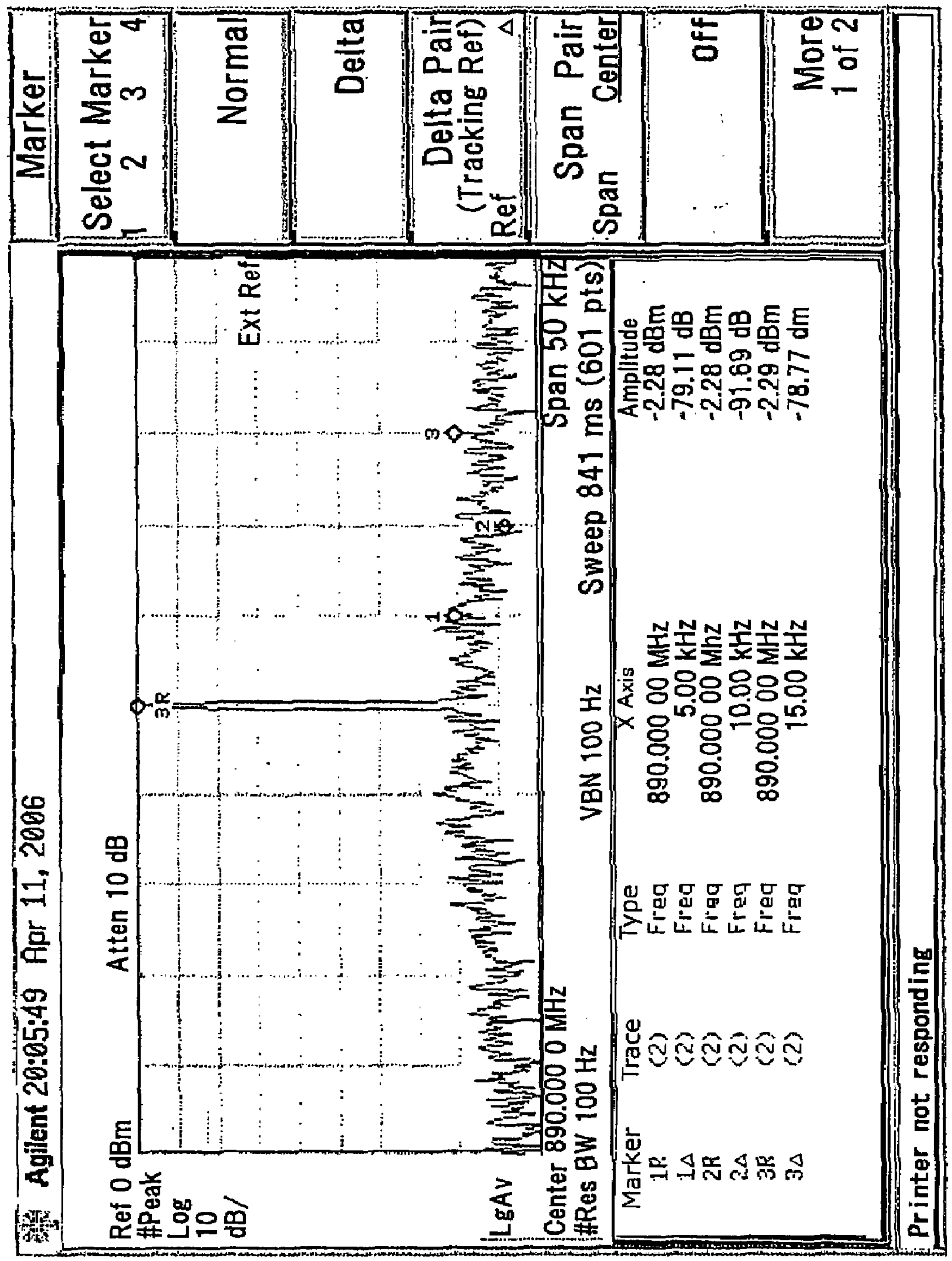
FIG. 5 is a diagram showing the spurious characteristic of an output Fout when an MCF is inserted.

Next, the effect of the first PLL oscillation circuit will be described referring to FIG. 2 to FIG. 5. FIG. 2 is a diagram showing the result of analyzing a digital signal output from the A/D converter when the reference signal contains a spurious wave. FIG. 3 is a diagram showing the spurious characteristic of an output Fout when an MCF is not inserted. FIG. 4 is a diagram showing the transfer characteristic of an MCF inserted. FIG. 5 is a diagram showing the spurious characteristic of an output Fout when an MCF is inserted.

FIG. 2 shows the result of analysis of a digital signal output from the A/D converter 4 when the reference signal Fref to be supplied to the A/D converter 4 has a frequency of 40 MHz and the spurious wave has a frequency of 40 MHz+600 kHz. The spurious wave occurs at a frequency apart by 600 kHz from the desired wave of the digital converter. The spurious wave affects the digital processing performed in the phase comparator 5, resulting in the occurrence of a spurious wave in the output Fout of the VCO 1.

As shown in FIG. 3, spurious waves occur on both sides of the center apart by 10 kHz.

The transfer characteristic of the MCF 11 is such that about 3 kHz indicated by "←→" in FIG. 4 is a pass band width so that a spurious wave detuned by 40 MHz to 600 kHz can be canceled.

Because the MCF 11 cancels the spurious wave contained in the reference signal Fref, a spurious wave does not occur even in the output Fout of the VCO 1 as shown in FIG. 5, as compared with the example of FIG. 3.

The scheme of inserting the MCF is effective particularly when the reference signal is supplied externally for the following reason. When the reference signal is supplied externally, the reference oscillation circuit is attached externally, so that the reference oscillation circuit itself often cannot be adjusted in which case canceling of a spurious wave by the MCF is effective.

The reference signal is also effective in cases of a sinusoidal wave and a rectangular wave.

The first PLL oscillation circuit can cancel noise, jitter or a spurious wave from the reference signal input to the A/D converter 4 using the MCF 11, thus allowing a frequency-divided signal of a stable output Fout to be input to the phase comparator 5. This brings about an effect of improving the phase noise characteristic and spurious characteristic of the output Fout from the VCO 1.

Figure 6:
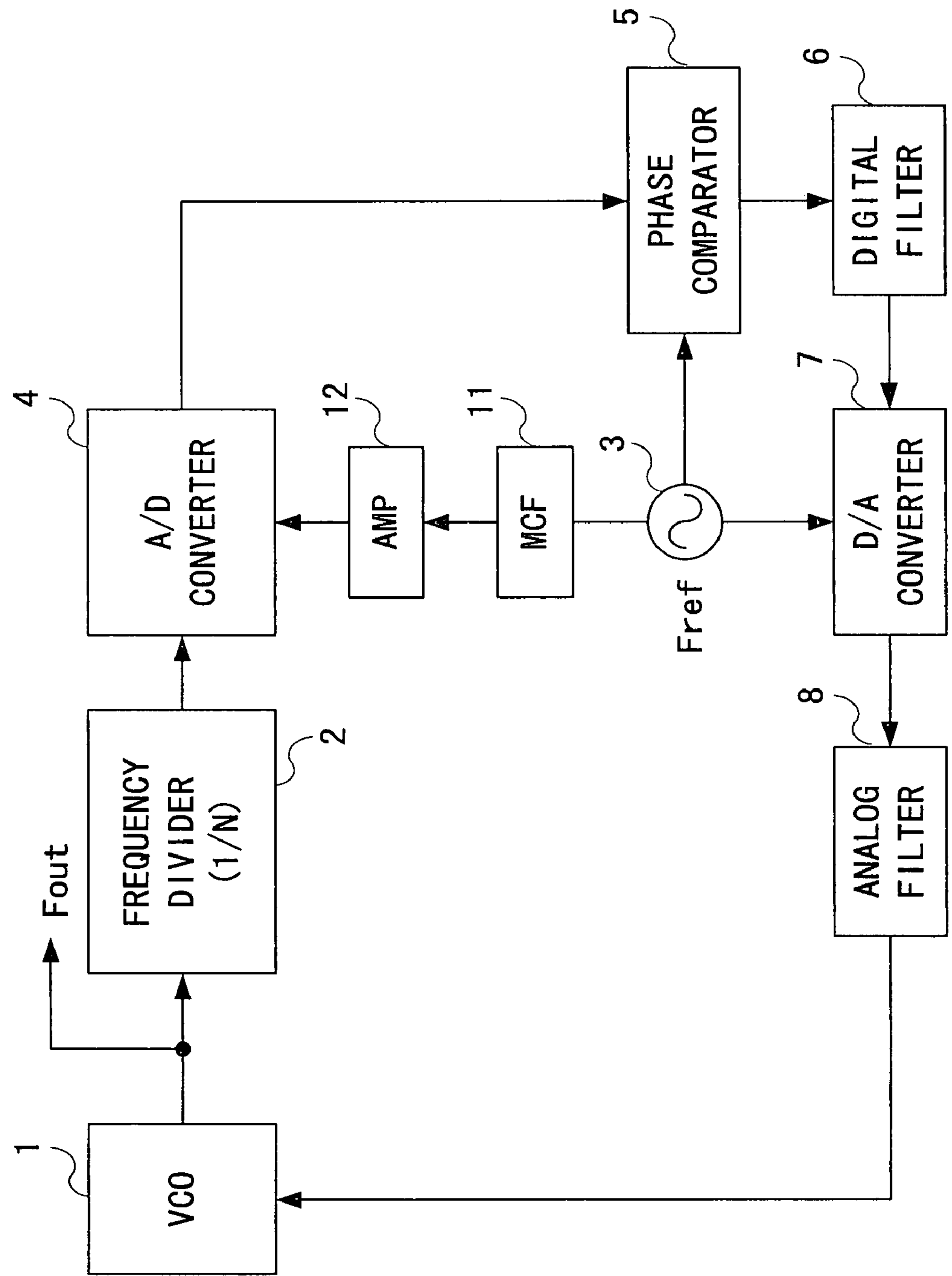
FIG. 6 is a configuration block diagram of a PLL oscillation circuit according to a second embodiment of the invention.

Next, a PLL oscillation circuit according to a second embodiment of the invention (second PLL oscillation circuit) will be described referring to FIG. 6. FIG. 6 is a configuration block diagram of the PLL oscillation circuit according to the second embodiment of the invention.

As shown in FIG. 6, the second PLL oscillation circuit has a VCO 1, a frequency divider 2, a reference oscillation circuit 3, an A/D converter 4, a phase comparator 5, a digital filter 6, a D/A converter 7, an analog filter 8, an MCF 11 and an amplifier (AMP) 12.

The difference from the first PLL oscillation circuit will be described. The second PLL oscillation circuit has the AMP (first amplifier) 12 provided at the output stage of the MCF 11 to amplify the signal level to the desired signal level when the insertion of the MCF 11 lowers the signal level.

Figure 7:
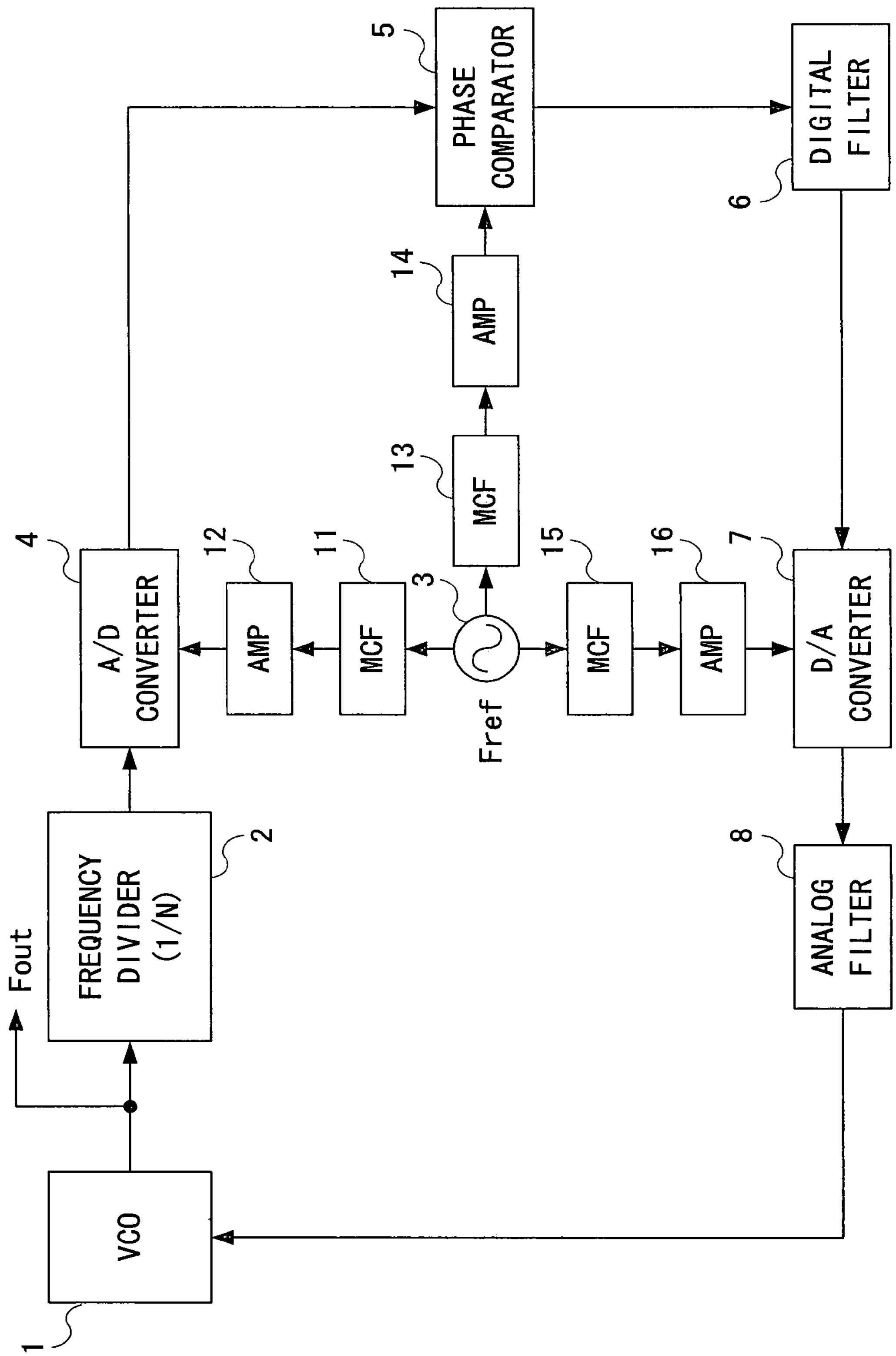
FIG. 7 is a configuration block diagram of a PLL oscillation circuit according to a third embodiment of the invention.

Next, a PLL oscillation circuit according to a third embodiment of the invention (third PLL oscillation circuit) will be described referring to FIG. 7. FIG. 7 is a configuration block diagram of the PLL oscillation circuit according to the third embodiment of the invention.

As shown in FIG. 7, the second PLL oscillation circuit has a VCO 1, a frequency divider 2, a reference oscillation circuit 3, an A/D converter 4, a phase comparator 5, a digital filter 6, a D/A converter 7, an analog filter 8, MCFs 11, 13, 15, and AMPs 12, 14, 16.

The difference from the first PLL oscillation circuit will be described. The third PLL oscillation circuit has the AMP 12 provided at the output stage of the MCF 11, has the AMP (second narrow-band crystal filter) 13 and the AMP (second amplifier) 14 provided between the reference oscillation circuit 3 and the phase comparator 5 in the named order, and has the AMP (third narrow-band crystal filter) 15 and the AMP (third amplifier) 16 provided between the reference oscillation circuit 3 and the D/A converter 7.

The AMP and MCF can be eliminated if unnecessary according to the states of the input signals to the phase comparator 5 and the D/A converter 7.

The states of the input signals to the A/D converter 4, the phase comparator 5 and the D/A converter 7 can be adjusted individually by the respective MCFs or AMPs.

Figure 8:
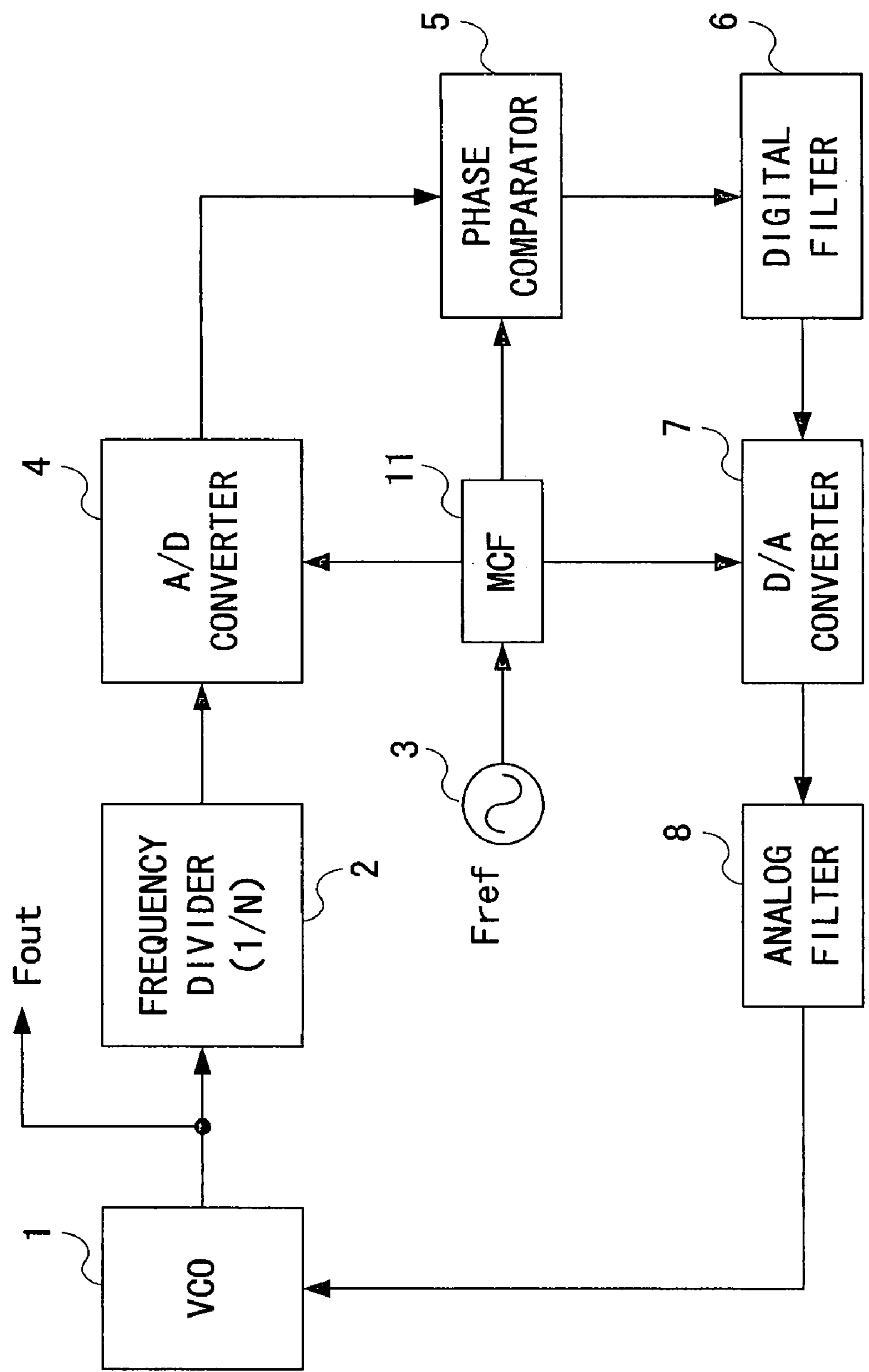
FIG. 8 is a configuration block diagram of a PLL oscillation circuit according to a fourth embodiment of the invention.

Next, a PLL oscillation circuit according to a fourth embodiment of the invention (fourth PLL oscillation circuit) will be described referring to FIG. 8. FIG. 8 is a configuration block diagram of the PLL oscillation circuit according to the fourth embodiment of the invention.

As shown in FIG. 8, the fourth PLL oscillation circuit has a VCO 1, a frequency divider 2, a reference oscillation circuit 3, an A/D converter 4, a phase comparator 5, a digital filter 6, a D/A converter 7, an analog filter 8, and an MCF 21.

The difference from the first PLL oscillation circuit will be described. The fourth PLL oscillation circuit has the MCF (fourth narrow-band crystal filter) 21 provided at the output stage of the reference oscillation circuit 3 so that the reference signal output from the MCF 21 is supplied to the A/D converter 4, the phase comparator 5 and the D/A converter 7.

The fourth PLL oscillation circuit can reduce the number of MCFs to make the configuration simpler than that of the third PLL oscillation circuit.

Figure 9:
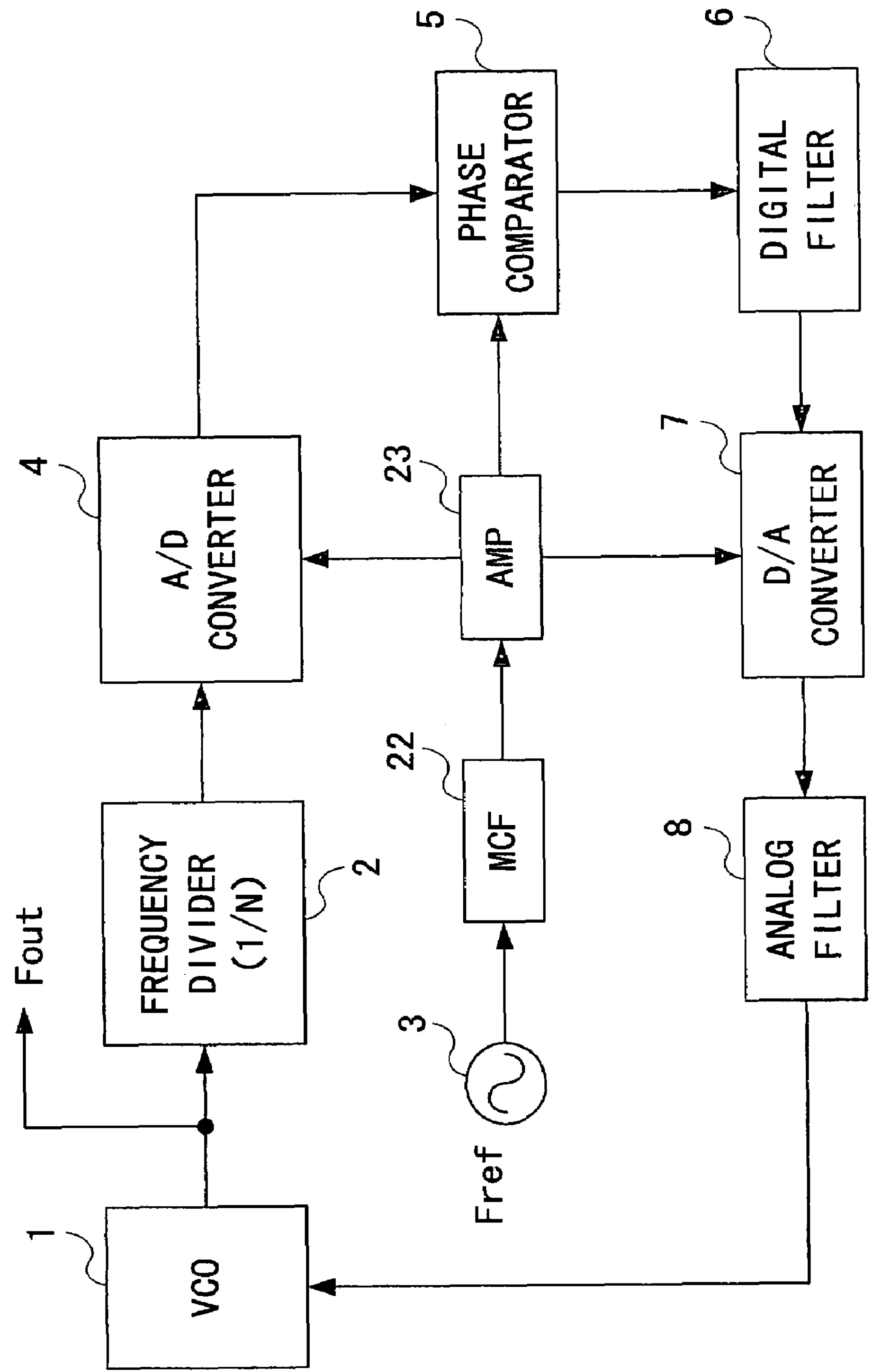
FIG. 9 is a configuration block diagram of a PLL oscillation circuit according to a fifth embodiment of the invention.

Next, a PLL oscillation circuit according to a fifth embodiment of the invention (fifth PLL oscillation circuit) will be described referring to FIG. 9. FIG. 9 is a configuration block diagram of the PLL oscillation circuit according to the fifth embodiment of the invention.

As shown in FIG. 9, the fifth PLL oscillation circuit has a VCO 1, a frequency divider 2, a reference oscillation circuit 3, an A/D converter 4, a phase comparator 5, a digital filter 6, a D/A converter 7, an analog filter 8, an MCF 22 and an AMP 23.

The difference from the first PLL oscillation circuit will be described. The fifth PLL oscillation circuit has the MCF (fifth narrow-band crystal filter) 22 and the AMP (fourth amplifier) 23 provided at the output stage of the reference oscillation circuit 3 so that the reference signal output from the AMP 23 is supplied to the A/D converter 4, the phase comparator 5 and the D/A converter 7.

The fifth PLL oscillation circuit can reduce the number of MCFs and AMPs to make the configuration simpler than that of the third PLL oscillation circuit.

The first to fifth PLL oscillation circuits can cancel noise, jitter or a spurious wave contained in the reference signal from the reference oscillation circuit 3 by means of the MCF 11 (13, 15, 21, 22), bringing about the effect that the phase noise characteristic and spurious characteristic of the output of the VCO 1 can be improved.

The effect is particularly noticeable when the MCF 11 is inserted between the reference oscillation circuit 3 and the A/D converter 4 in the first PLL oscillation circuit.

The second, third and fifth PLL oscillation circuits bring about the effect of supplying the desired reference signal to the A/D converter 4, etc. by insertion of the AMP 12 (14, 16, 23) when the insertion of the MCF 11 (13, 15, 22) lowers the signal level.

The present invention is suitable for a PLL oscillation circuit which can prevent the phase noise characteristic and spurious characteristic of a VCO output from being degraded.

What is claimed is:

1. A digitally controlled PLL oscillation circuit comprising:

a voltage controlled oscillator:

a frequency divider that divides an output from the voltage controlled oscillator;

a reference oscillation circuit that generates a reference signal;

an A/D converter that performs analog-to-digital conversion of an output from the frequency divider based on the reference signal;

a phase comparator that compares a phase of an output from the A/D converter with a phase of the reference signal;

a digital filter that filters an output from the phase comparator:

a D/A converter that performs digital-to-analog conversion of an output from the digital filter based on the reference signal;

an analog filter that smoothes an output of the D/A converter and outputs as a control signal for the voltage controlled oscillator; and a first narrow-band crystal filter provided between the reference oscillation circuit and the A/D converter so that the reference signal which is used in the A/D converter to convert an analog signal from the frequency divider to a digital signal to be supplied to the A/D converter from the reference oscillation circuit passes through the first narrow-band crystal filter;

a first amplifier is being provided between the first narrow-band crystal filter and the A/D converter to amplify a signal from the first narrow-band crystal filter.

2. The digitally controlled PLL oscillation circuit according to claim 1, wherein a second narrow-band crystal filter is provided between the reference oscillation circuit and the phase comparator so that the reference signal to be supplied to the phase comparator from the reference oscillation circuit passes through the second narrow-band crystal filter.

3. The digitally controlled PLL oscillation circuit according to claim 2, wherein a second amplifier is provided between the second narrow-band crystal filter and the phase comparator to amplify a signal from the second narrow-band crystal filter.

4. The digitally controlled PLL oscillation circuit according to claim 3, wherein a third narrow-band crystal filter is provided between the reference oscillation circuit and the D/A converter so that the reference signal to be supplied to the D/A converter from the reference oscillation circuit passes through the third narrow-band crystal filter.

5. The digitally controlled PLL oscillation circuit according to claim 4, wherein a third amplifier is provided between the third narrow-band crystal filter and the D/A converter to amplify a signal from the third narrow-band crystal filter.

6. The digitally controlled PLL oscillation circuit according to claim 2, wherein a third narrow-band crystal filter is provided between the reference oscillation circuit and the D/A converter so that the reference signal to be supplied to the D/A converter from the reference oscillation circuit passes through the third narrow-band crystal filter.

7. The digitally controlled PLL oscillation circuit according to claim 6, wherein a second amplifier is provided between the third narrow-band crystal filter and the D/A converter to amplify a signal from the third narrow-band crystal filter.

8. The digitally controlled PLL oscillation circuit according to claim 1, wherein a second narrow-band crystal filter is provided between the reference oscillation circuit and the D/A converter so that the reference signal to be supplied to the D/A converter from the reference oscillation circuit passes through the second narrow-band crystal filter.

9. The digitally controlled PLL oscillation circuit according to claim 8, wherein a second amplifier is provided between the second narrow-band crystal filter and the D/A converter to amplify a signal from the second narrow-band crystal filter.

10. A digitally controlled PLL oscillation circuit comprising:

a voltage controlled oscillator;

a frequency divider that divides an output from the voltage controlled oscillator;

a reference oscillation circuit that generates a reference signal;

an A/D converter that performs analog-to-digital conversion of an output from the frequency divider based on the reference signal;

a phase comparator that compares a phase of an output from the A/D converter with a phase of the reference signal;

a digital filter that filters an output from the phase comparator;

a D/A converter that performs digital-to-analog conversion of an output from the digital filter based on the reference signal;

an analog filter that smoothes an output of the D/A converter and outputs as a control signal for the voltage controlled oscillator; and a first narrow-band crystal filter provided between the reference oscillation circuit and the A/D converter so that the reference signal which is used in the A/D converter to convert an analog signal from the frequency divider to a digital signal to be supplied to the A/D converter from the reference oscillation circuit passes through the first narrow-band crystal filter;

a second narrow-band crystal filter is provided between the reference oscillation circuit and the phase comparator so that the reference signal to be supplied to the phase comparator from the reference oscillation circuit passes through the second narrow-band crystal filter, and a second amplifier being provided between the second narrow-band crystal filter and the phase comparator to amplify a signal from the second narrow-band crystal filter.

11. The digitally controlled PLL oscillation circuit according to claim 10, wherein a third narrow-band crystal filter is provided between the reference oscillation circuit and the D/A converter so that the reference signal to be supplied to the D/A converter from the reference oscillation circuit passes through the third narrow-band crystal filter.

12. The digitally controlled PLL oscillation circuit according to claim 11, wherein a third amplifier is provided between the third narrow-band crystal filter and the D/A converter to amplify a signal from the third narrow-band crystal filter.

13. A digitally controlled PLL oscillation circuit comprising:

a voltage controlled oscillator;

a frequency divider that divides an output from the voltage controlled oscillator;

a reference oscillation circuit that generates a reference signal;

an A/D converter that performs analog-to-digital conversion of an output from the frequency divider based on the reference signal;

a phase comparator that compares a phase of an output from the A/D converter with a phase of the reference signal;

a digital filter that filters an output from the phase comparator;

a D/A converter that performs digital-to-analog conversion of an output from the digital filter based on the reference signal;

an analog filter that smoothes an output of the D/A converter and outputs as a control signal for the voltage controlled oscillator; and a first narrow-band crystal filter provided between the reference oscillation circuit and the A/D converter so that the reference signal which is used in the A/D converter to convert an analog signal from the frequency divider to a digital signal to be supplied to the A/D converter from the reference oscillation circuit passes through the first narrow-band crystal filter:

a second narrow-band crystal filter being provided between the reference oscillation circuit and the D/A converter so that the reference signal to be supplied to the D/A converter from the reference oscillation circuit passes through the second narrow-band crystal filter, and a second amplifier being provided between the second narrow-band crystal filter and the D/A converter to amplify a signal from the second narrow-band crystal filter.

14. A digitally controlled PLL oscillation circuit comprising:

a voltage controlled oscillator;

a frequency divider that divides an output from the voltage controlled oscillator;

a reference oscillation circuit that generates a reference signal;

an A/D converter that performs analog-to-digital conversion of an output from the frequency divider based on the reference signal;

a phase comparator that compares a phase of an output from the A/D converter with a phase of the reference signal;

a digital filter that filters an output from the phase comparator;

a D/A converter that performs digital-to-analog conversion of an output from the digital filter based on the reference signal;

an analog filter that smoothes an output of the D/A converter and outputs as a control signal for the voltage controlled oscillator; and a first narrow-band crystal filter provided between the reference oscillation circuit and the A/D converter so that the reference signal which is used in the A/D converter to convert an analog signal from the frequency divider to a digital signal to be supplied to the A/D converter from the reference oscillation circuit passes through the first narrow-band crystal filter;

a second narrow-band crystal filter being provided between the reference oscillation circuit and the phase comparator so that the reference signal to be supplied to the phase comparator from the reference oscillation circuit passes through the second narrow-band crystal filter, a third narrow-band crystal filter being provided between the reference oscillation circuit and the D/A converter so that the reference signal to be supplied to the D/A converter from the reference oscillation circuit passes through the third narrow-band crystal filter, and a second amplifier being provided between the third narrow-band crystal filter and the D/A converter to amplify a signal from the third narrow-band crystal filter.

15. A digitally controlled PLL oscillation circuit comprising:

a voltage controlled oscillator;

a frequency divider that divides an output from the voltage controlled oscillator;

a reference oscillation circuit that generates a reference signal;

an A/D converter that performs analog-to-digital conversion of an output from the frequency divider based on the reference signal;

a phase comparator that compares a phase of an output from the A/D converter with a phase of the reference signal;

a digital filter that filters an output from the phase comparator;

a D/A converter that performs digital-to-analog conversion of an output from the digital filter based on the reference signal;

an analog filter that smoothes an output of the D/A converter and outputs as a control signal for the voltage controlled oscillator; and a narrow-band crystal filter and an amplifier that are provided at an output stage of the reference oscillation circuit so that the reference signal supplied from the reference oscillation circuit passes through the narrow-band crystal filter, is amplified by the amplifier, and is output to the A/D converter, the phase comparator and the D/A converter.

16. A digitally controlled PLL oscillation circuit comprising:

a voltage controlled oscillator;

a frequency divider that divides an output from the voltage controlled oscillator;

a reference oscillation circuit that generates a reference signal;

an A/D converter that performs analog-to-digital conversion of an output from the frequency divider based on the reference signal;

a phase comparator that compares a phase of an output from the A/D converter with a phase of the reference signal;

a digital filter that filters an output from the phase comparator;

a D/A converter that performs digital-to-analog conversion of an output from the digital filter based on the reference signal;

an analog filter that smoothes an output of the D/A converter and outputs as a control signal for the voltage controlled oscillator;

a first narrow-band crystal filter provided between the reference oscillation circuit and the A/D converter so that the reference signal to be supplied to the A/D converter from the reference oscillation circuit passes through the first narrow-band crystal filter, and a first amplifier being provided between the first narrow-band crystal filter and the A/D converter to amplify a signal from the first narrow-band crystal filter.

17. A digitally controlled PLL oscillation circuit comprising:

a voltage controlled oscillator;

a frequency divider that divides an output from the voltage controlled oscillator;

a reference oscillation circuit that generates a reference signal;

an A/D converter that performs analog-to-digital conversion of an output from the frequency divider based on the reference signal;

a phase comparator that compares a phase of an output from the A/D converter with a phase of the reference signal;

a digital filter that filters an output from the phase comparator;

a D/A converter that performs digital-to-analog conversion of an output from the digital filter based on the reference signal;

an analog filter that smoothes an output of the D/A converter and outputs as a control signal for the voltage controlled oscillator;

a first narrow-band crystal filter provided between the reference oscillation circuit and the A/D converter so that the reference signal to be supplied to the A/D converter from the reference oscillation circuit passes through the first narrow-band crystal filter, and a second narrow-band crystal filter being provided between the reference oscillation circuit and the phase comparator so that the reference signal to be supplied to the phase comparator from the reference oscillation circuit passes through the second narrow-band crystal filter; and a second amplifier being provided between the second narrow-band crystal filter and the phase comparator to amplify a signal from the second narrow-band crystal filter.

* * * * *